United States Patent
Momtaz

(10) Patent No.: US 7,330,508 B2
(45) Date of Patent: Feb. 12, 2008

(54) USING CLOCK AND DATA RECOVERY PHASE ADJUST TO SET LOOP DELAY OF A DECISION FEEDBACK EQUALIZER

(75) Inventor: Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 755 days.

(21) Appl. No.: 10/774,725

(22) Filed: Feb. 9, 2004

(65) Prior Publication Data

US 2005/0135470 A1 Jun. 23, 2005

Related U.S. Application Data

(60) Provisional application No. 60/530,968, filed on Dec. 19, 2003, provisional application No. 60/531,403, filed on Dec. 19, 2003, provisional application No. 60/531,402, filed on Dec. 19, 2003.

(51) Int. Cl.
*H03L 7/30* (2006.01)
*H03K 5/159* (2006.01)
*H03D 3/24* (2006.01)

(52) U.S. Cl. ............... 375/233; 375/354; 375/376

(58) Field of Classification Search ............ 375/233, 375/327, 340, 350, 376, 354, 375; 327/156; 331/1 A, 1 R, 18, 25
See application file for complete search history.

(56) References Cited

U.S. PATENT DOCUMENTS

| | | | |
|---|---|---|---|
| 6,064,272 A * | 5/2000 | Rhee | 331/1 A |
| 6,366,146 B2 * | 4/2002 | Fredriksson | 327/156 |
| 6,542,038 B2 * | 4/2003 | Nishimura et al. | 331/1 A |
| 6,556,637 B1 | 4/2003 | Moriuchi | |
| 6,931,088 B1 * | 8/2005 | Tomita | 375/376 |
| 2004/0258145 A1 | 12/2004 | Popescu et al. | |

FOREIGN PATENT DOCUMENTS

WO WO 2004/002023 A2 12/2003

OTHER PUBLICATIONS

European Search Report and Annex for Application No. EP04026608; date of completion Dec. 8, 2005, The Hague (2 pages).

* cited by examiner

*Primary Examiner*—Betsy L. Deppe

(57) ABSTRACT

In a method and apparatus for communicating data, a decision feedback equalizer equalizes received data to reduce channel related distortion in the received data. An extracted clock signal is generated from the equalized data. The phase of the extracted clock signal may be adjusted to compensate for processing delay during equalization of the received data. The extracted clock signal may be used to clock a retimer of the decision feedback equalizer to generate recovered data.

26 Claims, 7 Drawing Sheets

USING CLOCK AND DATA RECOVERY PHASE ADJUST TO SET LOOP DELAY OF A DECISION FEEDBACK EQUALIZER

CROSS-REFERENCE TO RELATED APPLICATION(S)

This application claims the benefit of U.S. Provisional Patent Application Ser. No. 60/530,968, entitled "USING CLOCK AND DATA RECOVERY PHASE ADJUST TO SET LOOP DELAY OF A DECISION FEEDBACK EQUALIZER", filed Dec. 19, 2003, the disclosure of which is incorporated herein by reference.

This application is related to U.S. Provisional Patent Application Ser. No. 60/531,403, entitled "CONTINUOUS TIME FILTER-DECISION FEEDBACK EQUALIZER ARCHITECTURE FOR OPTICAL CHANNEL EQUALIZATION", filed Dec. 19, 2003; and U.S. Provisional Patent Application Ser. No. 60/531,402, entitled "DECISION FEEDBACK EQUALIZER AND CLOCK AND DATA RECOVERY CIRCUIT FOR HIGH SPEED APPLICATIONS", filed Dec. 19, 2003, the disclosure of each of which is incorporated herein by reference.

BACKGROUND

Many high speed serial communication systems only transmit data over a communication media. In other words, these systems do not transmit clocks signals that may be used by a receiver to recover the data. Consequently, receivers for high speed serial communication systems often include a clock and data recovery circuit that produces a clock signal synchronized with the incoming data. The clock is then used to sample or recover the individual data bits.

In operation however, bandwidth limitations inherent in many communication media tend to create increasing levels of data distortion with increasing data rate and channel length. For example, band-limited channels tend to spread transmitted pulses. If the width of the spread pulse exceeds a symbol duration, overlap with neighboring pulses may occur, degrading the performance of the receiver. Therefore, typical high speed receivers may also include an adaptive equalizer, such as, for example, a decision feedback equalizer that removes or reduces channel induced inter-symbol interference.

In conventional receivers the extracted clock from the clock and data recovery circuit drives a retimer of the decision feedback equalizer to recover equalized data. However, variations in the delay along the processing path of the decision feedback equalizer can cause the clock and data recovery circuit to lose synchronization with the incoming data.

SUMMARY

In one aspect of the present invention a communication system includes a decision feedback equalizer adapted to reduce channel related distortion in received data and a clock and data recovery circuit coupled to the equalizer which generates an extracted clock signal having an adjustable phase offset from the equalized data to compensate for processing delays in the equalizer. In this aspect of the present invention the decision feedback equalizer includes a retimer that generates recovered equalized data from the equalized data in response to the extracted clock signal.

In another aspect of the present invention a communications system includes a decision feedback equalizer adapted to reduce channel related distortion in received data, a clock and data recovery circuit and a real time optimizer. In this aspect of the present invention a clock and data recovery circuit coupled to the equalizer generates an extracted clock signal from the equalized data. A retimer of the decision feedback equalizer then generates recovered equalized data from the equalized data in response to the extracted clock signal. In this aspect of the present invention the communications system further includes a real time optimizer coupled to the clock and data recovery circuit that generates a phase adjust signal, wherein the clock and data recovery circuit adjusts phase of the extracted clock signal in response to the phase adjust signal to compensate for processing delays in the decision feedback equalizer.

BRIEF DESCRIPTION OF THE DRAWINGS

These and other features, aspects, and advantages of the present invention will become better understood with regard to the following description, appended claims, and accompanying drawings, in which:

Figure 1:
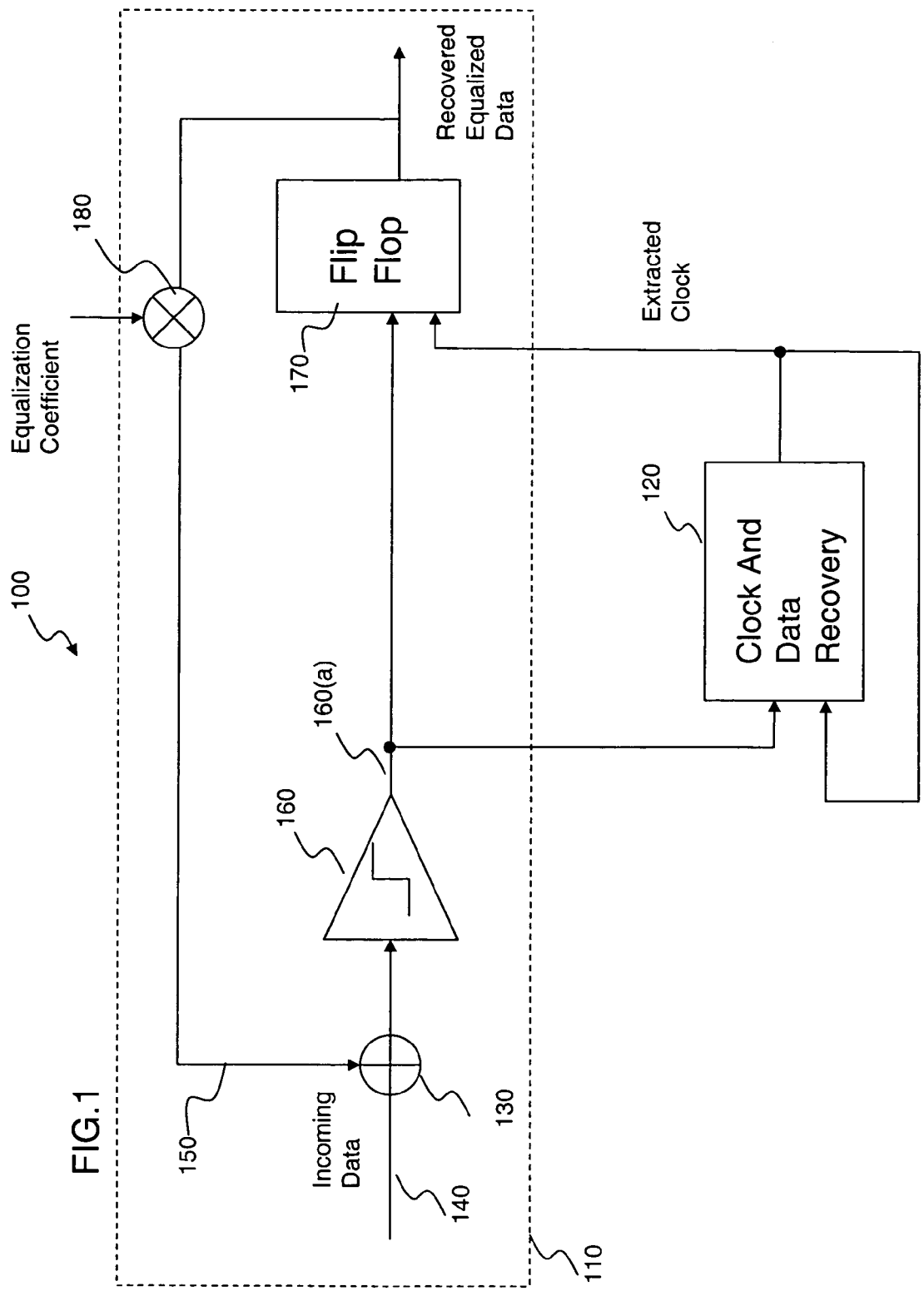
FIG. 1 is a simplified block diagram of a high speed receiver having an integrated decision feedback equalizer and a clock and data recovery circuit in accordance with an exemplary embodiment of the present invention.

In accordance with common practice the various features illustrated in the drawings are not to scale. On the contrary, the dimensions of the various features are arbitrarily expanded or reduced for clarity. In addition like reference numerals denote like features throughout the specification and figures.

DETAILED DESCRIPTION

Some embodiments of the present invention provide a high speed receiver with clock and data recovery and decision feedback equalization. Referring to FIG. 1, in one embodiment a one tap decision feedback equalizer 110 is combined with a clock and data recovery circuit 120 to provide a high performance receiver 100. In this embodiment summer 130 combines an incoming data signal 140 with an equalized feedback signal 150. A slicer 160 converts the output of the summer (soft decision) to a binary signal 160(*a*).

In this embodiment, the binary signal output by the slicer 160 directly drives the data input of flip flop 170 as well as a clock and data recovery circuit 120. The clock and data recovery circuit 120 therefore generates an extracted clock signal from the binary signal 160(*a*) output by the slicer rather than from the incoming data 140 as is done in conventional receivers. The extracted clock output by the clock and data recovery circuit 120 is then used to clock the decision feedback equalizer flip flop 170 that recovers the data from the binary signal 160(*a*) in response to the extracted clock.

Therefore, the clock and data recovery circuit 120 automatically aligns the rising edge of the extracted clock, for example, with transitions in the binary signal 160(*a*) output by the slicer 160. Therefore, the illustrated embodiment maintains the proper timing relationship between the flip flop 170 drive data and clock (i.e. the extracted clock) to ensure proper data recovery without the need for additional delay matching stages.

In the illustrated embodiment a multiplier 180 again scales the recovered equalized data output by the flip flop 170 by an equalization coefficient (g1) to generate the equalized feedback signal 150. The value of the equalization coefficient depends on the level of inter-symbol interference that is present in the incoming data. Typically the absolute value of the equalization coefficient (usually a negative number) increases with increasing inter-symbol interference. In one embodiment a real time optimization loop (not shown), such as a least mean square optimization loop monitors the bit error rate of the incoming signal and adjusts the value of the equalization coefficient in response to changes in the bit error rate.

Summer 130 then combines the equalized feedback signal 150 (typically a negative number) with the incoming data 140. The summer therefore subtracts a scaled version of the previous symbol from a current symbol to reduce or eliminate channel induced distortion such as inter-symbol interference. Therefore, in this embodiment, equalized data (i.e. data that has been processed to remove inter-symbol interference) drives the clock and data recovery circuit 120.

As a result, the clock and data recovery circuit 120 more readily locks onto the binary signal 160(*a*) as compared to a conventional receiver that locks onto than the incoming data. However, in this embodiment the delay along the processing path of the decision feedback equalizer may cause the clock and data recovery circuit to loose synchronization with the binary signal, thereby corrupting the output of the receiver.

Figure 2:
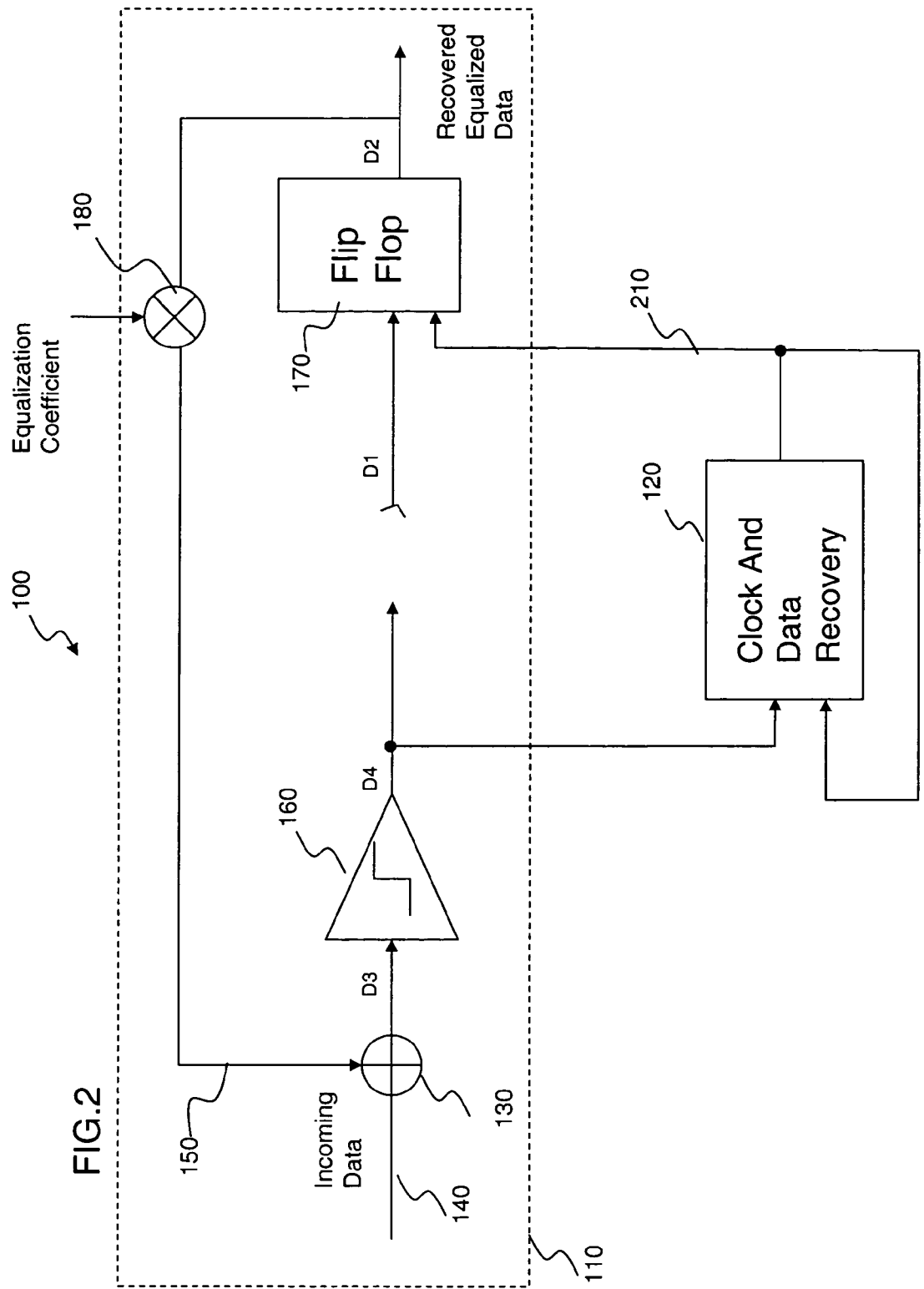
FIG. 2 is an open loop diagram of the receiver of FIG. 1 in accordance with an exemplary embodiment of the present invention.
Figure 3:
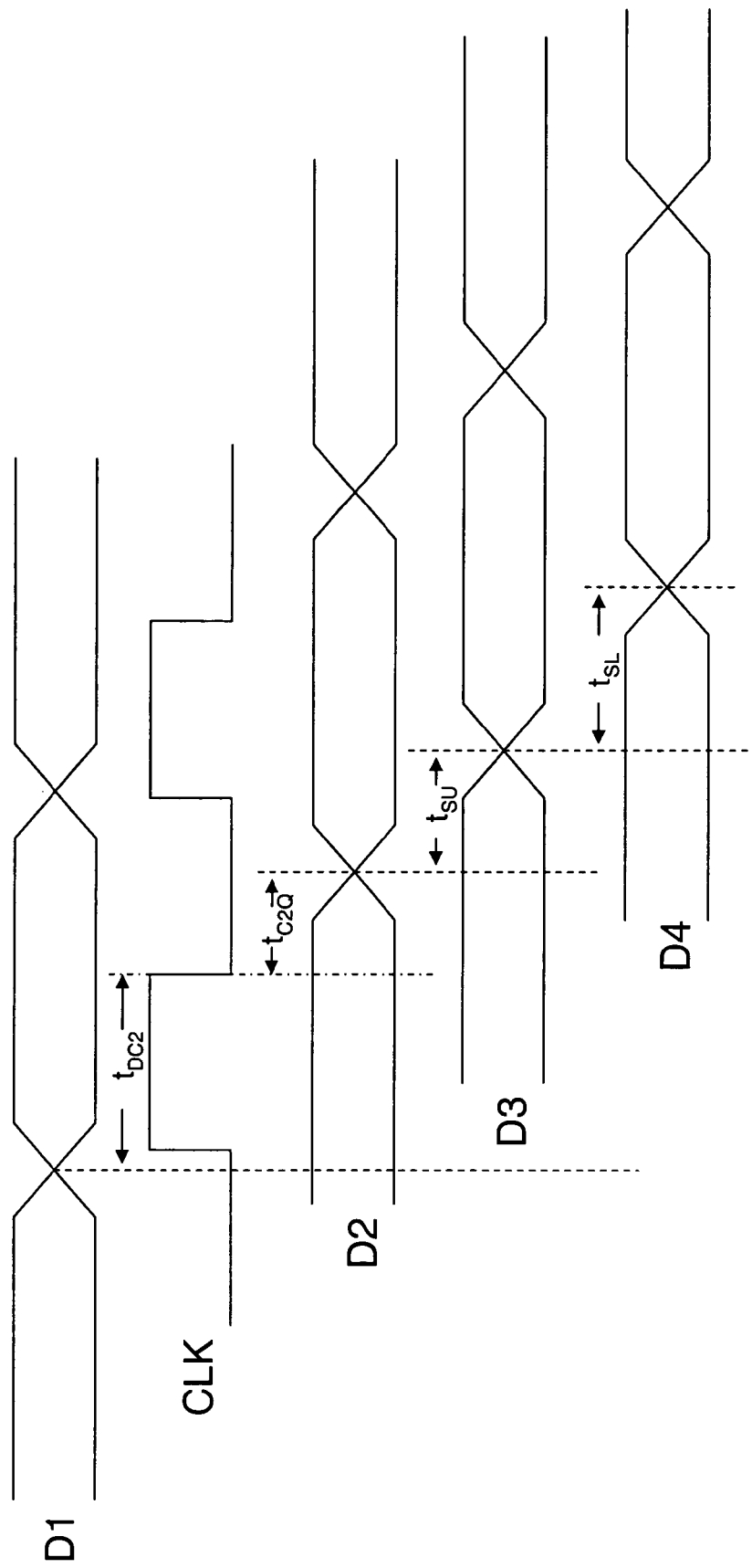
FIG. 3 is a timing diagram at a plurality of points along the open loop diagram of FIG. 2 graphically illustrating one example of processing delay through the receiver elements in accordance with an exemplary embodiment of the present invention.

For example, FIG. 2 is an open loop diagram of the decision feedback equalizer of FIG. 1 with the processing path interrupted at the input to the decision feedback flip flop 170 which in this example is timed by clock signal 210 (CLK). FIG. 3 graphically illustrates one example of timing waveforms at various points along the processing path of the open loop diagram of FIG. 2. In operation the various components of the decision feedback equalizer add delay along the processing path of the equalizer.

For example, in this embodiment the decision feedback flip flop 170 latches input data signal (D1) in response to a clock signal (CLK). In the embodiment of FIG. 2 a clock and data recovery circuit 120 may be used to generate a flip flop clock signal (CLK) 210 having its leading edge aligned with the transition edges of the flip flop data signal (D1). However, practical limitations in the design and implementation of the clock and data recovery circuit typically result in a slight offset between the phase of the input data signal (D1) and the clock signal (CLK). In one embodiment the flip flop 170 latches on the falling edge of clock signal (CLK) to generate a flip flop output signal (D2) after a flip flop clock to Q delay (illustrated as $t_{C2Q}$ in the open loop timing diagram of FIG. 3). In this embodiment the phase offset between the transition in the input data signal (D1) and the falling edge of the flip flop clock signal is denoted $t_{D2C}$ in the open loop timing diagram of FIG. 3.

Similarly summer 130 combines a feedback equalization signal with incoming data to generate soft decision (D3) having a summer delay ($t_{SU}$) with respect to the equalization signal (D2). In this embodiment the summer output (D3) drives a slicer that adds a slicer delay illustrated as ($t_{SL}$). Therefore the total delay ($t_{DFE}$) along the processing path of the decision feedback equalizer may be represented as given in Eq. (1) below:

$$t_{DFE} = t_{D2C} + t_{C2Q} + t_{SU} + t_{SL} \quad (1)$$

Thus, if the total delay along the decision feedback equalizer loop ($t_{DFE}$) is equal to a full period, the transition edge of the binary signal output by the slicer (D4) is properly aligned with the transition point of previous flip flop input (D1). However, if the total delay along the decision feedback equalizer loop ($t_{DFE}$) is not equal to a full period then the transition edge of the binary signal output by the slicer (D4) is shifted relative to the transition edge of previous flip flop input (D1).

Moreover, in this instance, the clock and data recovery circuit 120 shifts the leading edge of the extracted clock signal (CLK) 210 to align it with the input data (D4). The shift in leading edge of the extracted clock signal (CLK) in turn alters the separation ($t_{D2C}$) between the transition in the input data signal (D1) and the falling edge of the flip flop clock signal as well as the total delay ($t_{DFE}$) along the processing path of the decision feedback equalizer.

In practice, the total shift ($\Delta$CLK) in the extracted clock signal (CLK) is proportionate to the equalization coefficient (g1) if the total delay ($t_{DFE}$) along the processing path of the decision feedback equalizer is not equal to one period of the incoming data as detailed below in Eq. (2).

$$\Delta CLK = K^*(T - t_{DFE})^2 \quad (2)$$

where K is a constant that is proportional to the equalization coefficient (g1). Thus, if the total delay ($t_{DFE}$) along the processing path of the decision feedback equalizer is not equal to one period of the incoming data then the shift in the extracted clock signal increases with increasing levels of equalization (i.e. as g1 and therefore K increase). In operation, if the shift in the extracted clock becomes too large the clock and data recovery circuit may lose synchronization with the incoming data and the receiver possibly corrupting the output of the receiver.

In addition, the shift between the delay along the processing path of the decision feedback equalizer and the period (T) of the incoming data that maximizes receiver performance may not be zero but rather may be dependent upon the received data. Therefore, a high speed receiver in accordance with an exemplary embodiment of the present invention adjusts the total delay along the processing path of the decision feedback equalizer to provide higher receiver performance.

For example, in one embodiment a clock and data recovery circuit generates an extracted clock that has the same frequency as an incoming data signal. The clock and data recovery circuit further aligns one of the edges of the extracted clock, such as for example, the rising edge, with the transition edge of the incoming data signal. In this embodiment the clock and data recovery circuit also adjusts the phase of the extracted clock signal to optimize the total delay along the processing path of the decision feedback equalizer to reduce the receiver bit error rate and sensitivity to inter-symbol interference.

Figure 4:
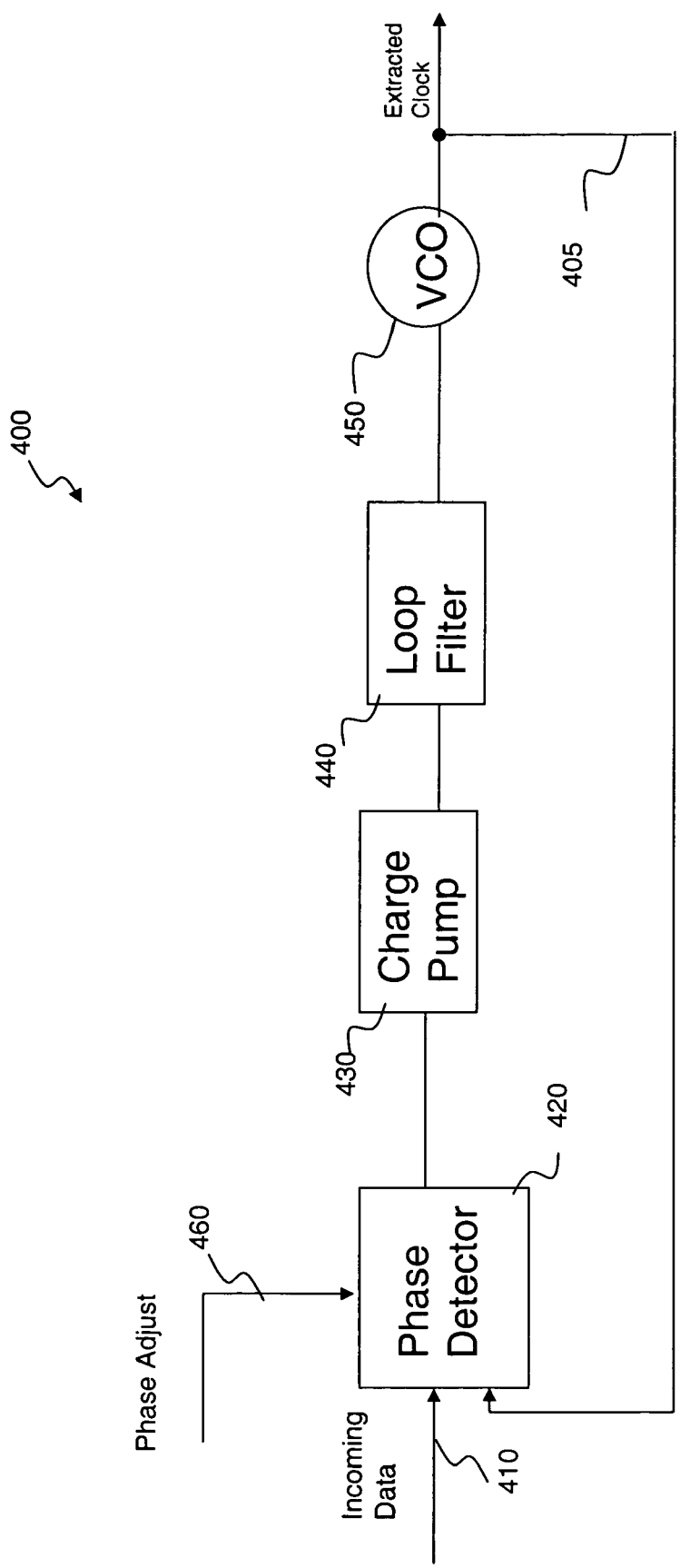
FIG. 4 is a simplified block diagram of a clock and data recovery circuit with an adjustable phase offset for use in the receiver of FIG. 1 in accordance with an exemplary embodiment of the present invention.

FIG. 4 is a simplified block diagram of a clock and data recovery circuit 400 for generating an extracted clock signal 405 having a frequency that is synchronized with the frequency of the incoming data 410 and having a variable phase. In this embodiment the clock and data recovery circuit 400 includes a phase detector 420 that receives, by way of example, the incoming data signal 410 (e.g. the binary signal 160(a) output by the slicer of FIG. 1) on a first input and the output 405 of a voltage control oscillator 450 at a second input. In one embodiment, the phase detector 420 determines a phase relationship between the output 405 of the voltage control oscillator 450 and the incoming data signal 410.

For example, in one embodiment the phase detector 420 compares transitions in the incoming data signal 410 to the rising edges or the falling edges of the output 405 of the voltage control oscillator 450. The phase detector 420 then produces, by way of example, a phase error signal that is proportional to the phase relationship between the two input signals.

A charge pump 430 then generates a current signal having a magnitude that varies as a function of the magnitude of the error signal generated by the phase detector 420. A loop filter 440 then filters out the high frequency components of the current signal output by charge pump 430 and forwards the filtered signal to the voltage controlled oscillator 450.

In one embodiment, if the incoming data signal 410 leads the output signal 405 of the voltage control oscillator 450, the frequency of the output signal 405 of the voltage controller oscillator 450 is less than the frequency of the incoming data signal 410. In this instance, the charge pump 430 increases its output current to provide a control signal which increases the frequency of the output signal 405 of the voltage control oscillator 450.

As the frequency of the output signal 405 of the voltage control oscillator 450 increases, its edges come sooner in time (i.e., the edges advance in time). Thus, for example, the rising edges of the output signal 405 of the voltage control oscillator 450 come in better alignment with the transitions or other reference points in the incoming data signal 410. Thus, the feedback may insure that the incoming data signal and the output signal of the voltage control oscillator have the desired frequency relationship for retiming the incoming data via a data retimer (e.g. flip flop 170 of FIG. 1).

In addition, in one embodiment a phase adjust signal 460 may be used to create an offset in the detected phase relationship between the incoming data signal and the output of the voltage control oscillator. For example, if the phase of the incoming data signal 410 and the output signal 405 of the voltage control oscillator 450 were perfectly aligned and the offset injection signal called for a five degree phase offset, the phase detector 420 would output a phase error signal corresponding to a five degree phase difference between the two signals.

Channel induced distortions may also increase the receiver's bit error rate. As a result, signal distortion may be such that in some embodiments the optimum value of the total delay along the processing path of the decision feedback equalizer may not be exactly equal to one period of the incoming data. Therefore, in one embodiment, the phase adjust signal may be optimized to compensate for the delay along the processing path of the decision feedback equalizer as well as channel induced distortion in the received signal.

Figure 5:
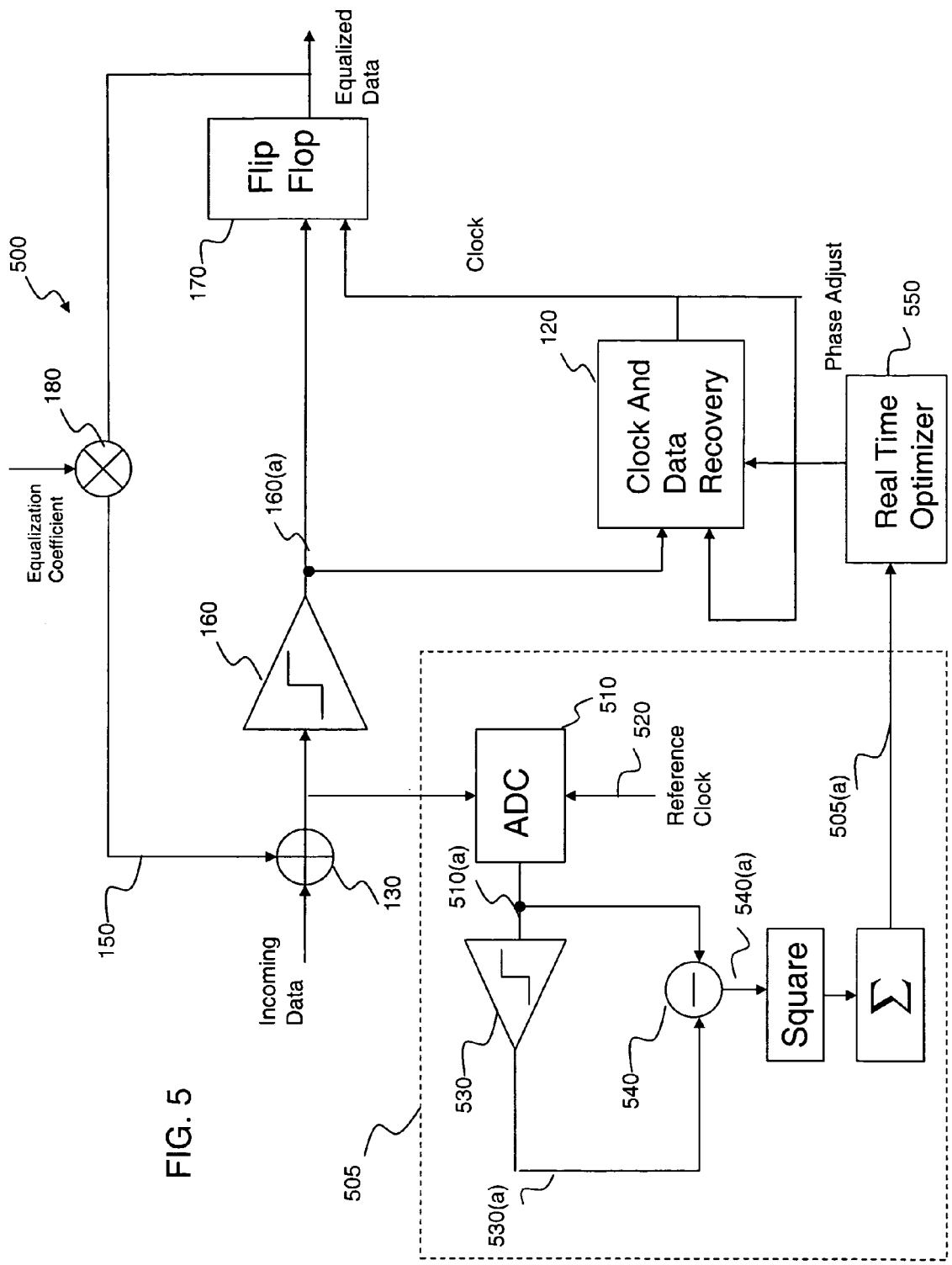
FIG. 5 is a simplified block diagram of high speed receiver having an integrated decision feedback equalizer and a clock and data recovery circuit and an error generation circuit for optimizing adjustable phase offset of the clock and data recovery circuit in accordance with an exemplary embodiment of the present invention.

For example, the high speed receiver 500 illustrated in FIG. 5 includes, by way of example a monitor circuit 505 that tracks the distortion in the soft decision data output by the summer 130 of the decision feedback equalizer. In this embodiment the monitor circuit 505 generates a distortion error signal 505(a) from the soft decision data that may be used by a real time optimizer 550 to adjust the phase offset signal of the clock and data recovery circuit 120 to improve the performance of the receiver 500.

In one embodiment the monitor circuit 505 may include an analog to digital converter 510 that converts the analog soft decision signal output by the summer 130 of the decision feedback equalizer to a digital signal. In one embodiment the analog to digital converter samples the analog soft decision at a relatively low rate in response to a low speed reference clock. The reference clock 520 may be, for example, a low-frequency signal generated by a stable oscillation source (e.g., a crystal).

In one embodiment a delay lock loop (not shown) may be used to align the transition edges of the low frequency reference clock 520 with the transition edges of the clock signal which clocks the flip flop 170 of the decision feedback equalizer to ensure that the monitor circuit 505 is properly synchronized with the decision feedback equalizer. A delay lock loop which is suitable for synchronizing the reference clock 520 and the clock signal which clocks the flip flop 170 of the decision feedback equalizer is disclosed in commonly owned U.S. Provisional Patent Application Ser. No. 60/531,095 entitled "HIGH FREQUENCY BINARY PHASE DETECTOR", filed Dec. 19, 2003, the disclosure of which is incorporated herein by reference.

A digital limiter 530 compares the quantized soft decision output by the analog to digital converter 510 with a threshold and generates a binary signal (e.g., one or minus one) having a low value if the quantized signal is less than the threshold and a high value if the quantized signal is greater than or equal to the threshold. A combiner 540 generates an error signal 540(a) by subtracting the quantized soft decision 510(a) output by the analog to digital converter with the binary signal 530(a) output by the digital limiter.

In some embodiments the error signal 540(a) is squared and then accumulated to generate a sum square error signal. In this embodiment, a real time optimizer 550 may be used to reduce the value of the sum square error signal as a function of the phase offset of the clock and data recovery circuit 120.

Figure 6:
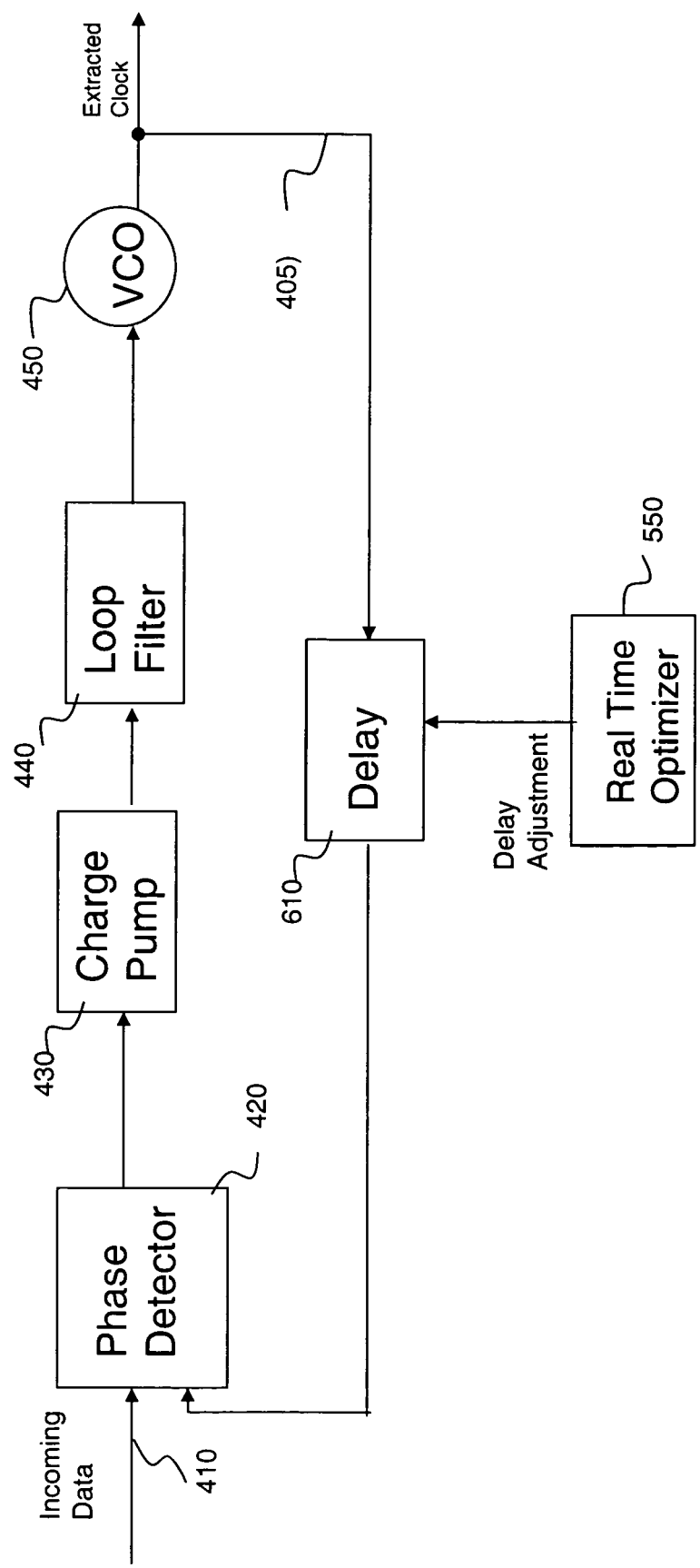
FIG. 6 is a simplified block diagram of a clock and data recovery circuit with an adjustable delay for use in the receiver of FIG. 1 in accordance with an exemplary embodiment of the present invention.

One of skill in the art will appreciate that the phase of the clock and data recovery circuit may be adjusted in a variety of ways. For example, FIG. 6 is a simplified block diagram of a clock and data recovery circuit 600 that includes a delay 610 coupled between the voltage control oscillator 450 and the phase detector 420 to adjust the phase of the extracted clock signal output by the oscillator 450 to compensate for changes in the delay along the processing path of the decision feedback equalizer of FIG. 1. In this embodiment a real time optimizer 550 may again be used to vary the delay through delay element 610 to reduce the sum square error of the equalized data as previously described with respect to FIG. 5.

Figure 7:
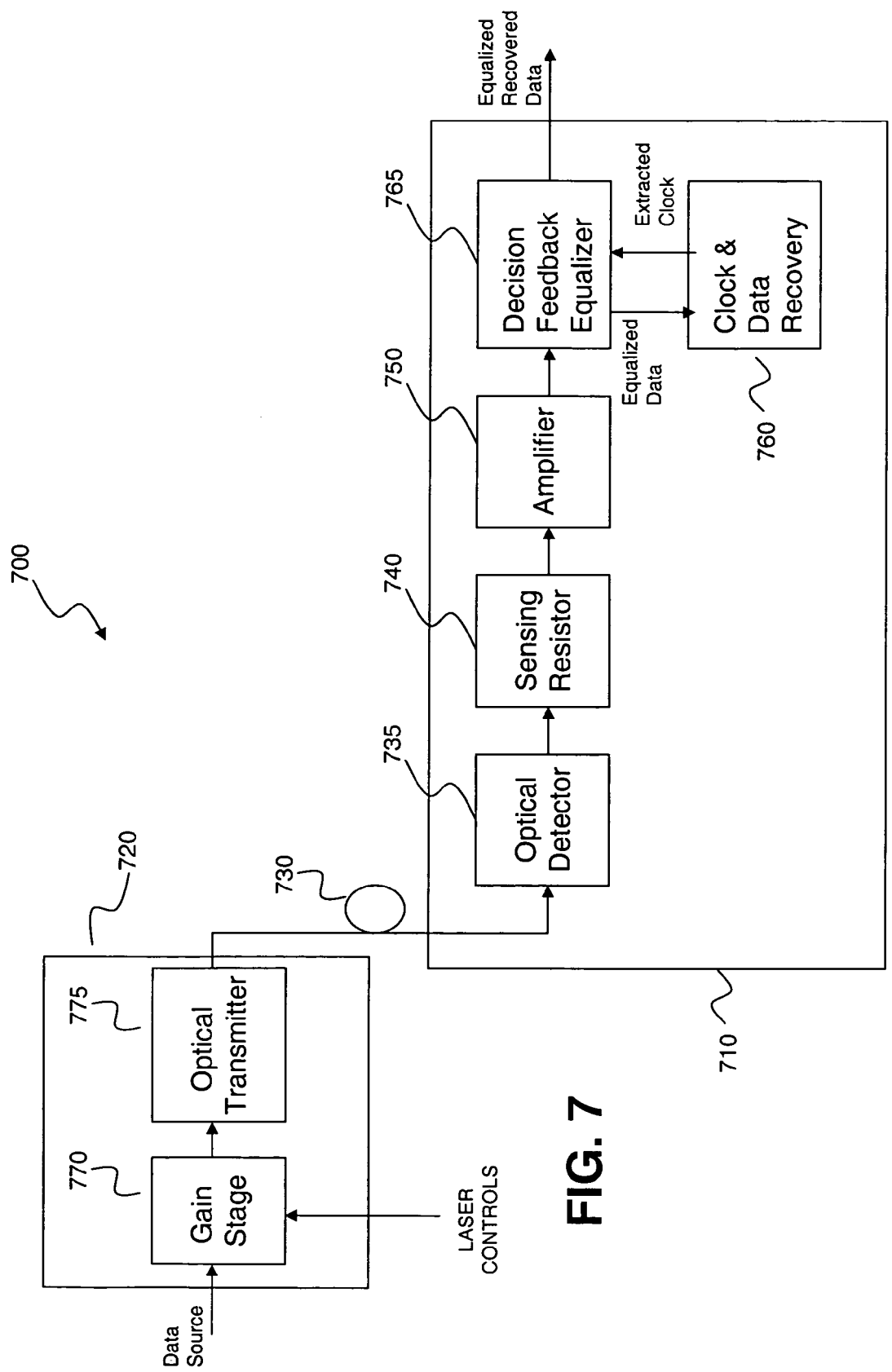
FIG. 7 is a simplified block diagram of an optical communication system in accordance with an exemplary embodiment of the present invention.

The integrated decision feedback equalizer and clock and data recovery circuit of the present invention may be integrated into any of a variety of applications. For example, referring to FIG. 7, the described exemplary integrated decision feedback equalizer and clock and data recovery circuit may be incorporated into an optical receiver assembly 710 of an optical communication system 700. The optical system 700 includes an optical transmitter 720 and an optical fiber network 730 that carries the optical signal to the optical receiver assembly 710. Those skilled in the art will appreciate that the present invention is not limited to a single optical transmitter and receiver. Rather practical optical communications systems may have one or more optical transmitters as well as one or more optical receivers.

The illustrated receive path includes an optical detector 735, sensing resistor 740, one or more amplifiers 750, clock and data recovery circuit 760, and decision feedback equalizer 765. The optical detector 735 can be any known prior art optical detector. Such prior art detectors convert incoming optical signals into corresponding electrical output signals that can be electronically monitored.

A transmit path includes, by way of example, one or more gain stage(s) 770 coupled to an optical transmitter 775. In one embodiment an analog data source provides an analog data signal that modulates the output of the optical transmitter In other embodiments baseband digital modulation or frequency modulation may be used. In this embodiment the gain stage(s) amplify the incoming data signal and the amplified data signal in turn drives the optical transmitter 775.

The gain stage 770 may have multiple stages, and may receive one or more control signals for controlling various different parameters of the output of the optical transmitter. The optical transmitter may, for example, be a light emitting diode or a surface emitting laser or an edge emitting laser that operates at high speeds such as 10 Gigabits per second (Gbps) or higher.

A receive fiber optic cable 730 carries an optical data signal to the optical detector 735. In operation, when the transmit optical beam is incident on a light receiving surface area of the optical detector, electron-hole pairs are generated. A bias voltage applied across the device generates a flow of electric current having an intensity proportional to the intensity of the incident light. In one embodiment, this current flows through sensing resistor 740, and generates a voltage.

The sensed voltage is amplified by the one or more amplifier(s) 750. The output of amplifier 750 drives the decision feedback equalizer 765. As illustrated in FIG. 5, the decision feedback equalizer, includes, by way of example, a slicer that generates a binary signal that drives the clock and data recovery circuit. The clock and data recovery circuit generates an extracted clock signal from the binary signal which is coupled to a decision feedback equalizer retimer (as illustrated in FIG. 5) to retime the equalized data.

It will be appreciated by those of ordinary skill in the art that the invention can be embodied in other specific forms without departing from the spirit or essential character thereof. Thus, the teachings herein may be applied to different receivers, decision feedback equalizers and clock and data recovery circuits. For example, delay may be provided for the clock and data recovery circuits using a variety of delay techniques. The present invention is therefore considered in all respects to be illustrative and not restrictive. The scope of the invention is indicated by the appended claims, and all changes that come within the meaning and range of equivalents thereof are intended to be embraced therein.

What is claimed is:

1. A communications system comprising:
    a decision feedback equalizer adapted to reduce channel related distortion in received data, wherein the decision feedback equalizer is configured to generate equalized data; and
    a clock and data recovery circuit coupled to the decision feedback equalizer, the clock and data recovery circuit configured to generate an extracted clock signal,
    wherein the clock and data recovery circuit is configured to adjust a phase of the extracted clock signal relative to the equalized data to compensate for processing delays in the decision feedback equalizer, and
    wherein the decision feedback equalizer includes a retimer that is configured to generate recovered equalized data from the equalized data in response to the extracted clock signal.

2. The communications system of claim 1 wherein the decision feedback equalizer comprises a summer that is configured to generate a combined signal by combining an equalized feedback signal with the received data to reduce the channel related distortion.

3. The communications system of claim 2 wherein the decision feedback equalizer further comprises a slicer coupled to the summer, wherein the slicer is configured to generate the equalized data by converting the combined signal to a binary signal and wherein the clock and data recovery circuit is configured to generate the extracted clock signal from the binary signal.

4. The communications system of claim 3 wherein the equalizer retimer comprises a flip flop coupled to the slicer and the clock and data recovery circuit, and wherein the flip flop is configured to generate recovered equalized data from the binary signal in response to the extracted clock signal.

5. The communications system of claim 1 wherein the clock and data recovery circuit comprises:
    a phase detector configured to generate a phase error signal in accordance with difference in phase of the extracted clock signal and the equalized data;
    a voltage controlled oscillator configured to generate the extracted clock signal as a function of the phase error signal; and
    a delay coupled between the voltage control oscillator and the phase detector configured to adjust the phase of the extracted clock signal.

6. The communications system of claim 1 wherein the clock and data recovery circuit comprises:
    a phase detector configured to generate a phase error signal in accordance with a difference in phase of the extracted clock signal and the equalized data; and
    a voltage controlled oscillator configured to generate the extracted clock signal as a function of the phase error signal,
    wherein the phase detector is configured to adjust the phase error signal in response to a phase offset signal to adjust the phase of the extracted clock signal.

7. A communication system comprising:
    a transmitter transmitting an information signal over a communication media; and
    a receiver coupled to the communication media for receiving the transmitted information signal, wherein the receiver comprises:
        a decision feedback equalizer adapted to reduce channel related distortion in received data, wherein the decision feedback equalizer is configured to generate equalized data; and a clock and data recovery circuit coupled to the equalizer, the clock and data recovery circuit configured to generate an extracted clock signal,
wherein the clock and data recovery circuit is configured to adjust a phase of the extracted clock signal relative to the equalized data to compensate for processing delays in the decision feedback equalizer, and
wherein the decision feedback equalizer includes a retimer that is configured to generate recovered equalized data from the equalized data in response to the extracted clock signal.

8. The communications system of claim 7 wherein the decision feedback equalizer comprises a summer that is configured to generate a combined signal by combining an equalized feedback signal with the received data to reduce the channel related distortion.

9. The communications system of claim 8 wherein the decision feedback equalizer further comprises a slicer coupled to the summer, wherein the slicer is configured to generate the equalized data by converting the combined signal to a binary signal and wherein the clock and data recovery circuit is configured to generate the extracted clock signal from the binary signal.

10. The communications system of claim 9 wherein the equalizer retimer comprises a flip flop coupled to the slicer and the clock and data recovery circuit, and wherein the flip flop is configured to generate recovered equalized data from the binary signal in response to the extracted clock signal.

11. The communications system of claim 10 wherein the equalizer further comprises a multiplier coupled to the retimer and wherein the equalizer is configured to apply an equalization coefficient to the recovered equalized data to generate the equalized feedback signal.

12. A communications system comprising:
a decision feedback equalizer adapted to reduce channel related distortion in received data, the decision feedback equalizer comprising:
a summer that is configured to combine an equalized feedback signal with the received data,
a slicer coupled to the summer, the slicer being configured to convert the combined signal to a binary signal;
a retimer coupled to the slicer, the retimer being configured to generate recovered equalized data from the binary signal in response to an extracted clock signal, and
a multiplier coupled to the retimer, the multiplier being configured to apply an equalization coefficient to the recovered equalized data to generate the equalized feedback signal; and
a clock and data recovery circuit coupled to the slicer, the clock and data recovery circuit being configured to generate the extracted clock signal from the binary signal, wherein the clock and data recovery circuit is configured to adjust phase of the extracted clock signal to compensate for processing delays in the decision feedback equalizer.

13. The communications system of claim 12 wherein the clock and data recovery circuit comprises:
a phase detector configured to generate a phase error signal in accordance with a difference in phase of the extracted clock signal and the binary signal;
a voltage controlled oscillator configured to generate the extracted clock signal as a function of the phase error signal; and
a delay coupled between the voltage control oscillator and the phase detector and configured to adjust phase of the extracted clock signal.

14. The communications system of claim 12 wherein the clock and data recovery circuit comprises:
a phase detector configured to generate a phase error signal in accordance with a difference in phase of the extracted clock signal and the binary signal; and
a voltage controlled oscillator configured to generate the extracted clock signal as a function of the phase error signal, wherein the phase detector is configured to adjust the phase error signal in response to a phase offset signal to adjust phase of the extracted clock signal.

15. A communications system comprising:
a decision feedback equalizer adapted to reduce channel related distortion in received data, wherein the decision feedback equalizer generates equalized data; and
a clock and data recovery circuit coupled to the equalizer, wherein the clock and data recovery circuit is configured to generate an extracted clock signal from the equalized data, and wherein the decision feedback equalizer includes a retimer that is configured to generate recovered equalized data from the equalized data in response to the extracted clock signal; and
a real time optimizer coupled to the clock and data recovery circuit, wherein the real time optimizer is configured to generate a phase adjust signal and wherein the clock and data recovery circuit is configured to adjust a phase of the extracted clock signal in response to the phase adjust signal to compensate for processing delays in the decision feedback equalizer.

16. The communications system of claim 15 wherein the decision feedback equalizer comprises a summer that is configured to combine an equalized feedback signal with the received data to generate the equalized data.

17. The communications system of claim 16 further comprising a monitor circuit is configured to generate a sum square error signal from the equalized data and wherein the real time optimizer is configured to adjust the phase adjust signal to reduce the sum square error signal.

18. The communications system of claim 17 wherein the decision feedback equalizer further comprises a slicer coupled to the summer, the slicer being configured to convert the combined signal to a binary signal, wherein the clock and data recovery circuit is configured to generate the extracted clock signal from the binary signal.

19. The communications system of claim 18 wherein the equalizer retimer comprises a flip flop coupled to the slicer and the clock and data recovery circuit and wherein the flip flop is configured to generate the recovered equalized data from the binary signal in response to the extracted clock signal.

20. The communications system of claim 15 wherein the clock and data recovery circuit comprises:
a phase detector configured to generate a phase error signal in accordance with difference in phase of the extracted clock signal and the equalized data;
a voltage controlled oscillator configured to generate the extracted clock signal as a function of the phase error signal; and
a delay coupled between the voltage control oscillator and the phase detector configured to adjust phase of the extracted clock signal.

21. The communications system of claim 15 wherein the clock and data recovery circuit comprises:

a phase detector configured to generate a phase error signal in accordance with a difference in phase of the extracted clock signal and the equalized data; and a voltage controlled oscillator configured to generate the extracted clock signal as a function of the phase error signal, wherein the phase detector is configured to adjust the phase error signal in response to a phase offset signal to adjust phase of the extracted clock signal.

22. A method comprising:

providing received data to a decision feedback equalizer;

generating, by the decision feedback equalizer, a binary signal according to the received data;

generating a phase delay signal based on processing delays associated with the decision feedback equalizer;

extracting a clock signal from the binary signal according to the phase delay signal, to thereby compensate for the processing delays; and retiming the binary signal according to the clock signal.

23. The method of claim 22 wherein a real time optimizer generates the phase delay signal based on an amount of channel-induced distortion associated with the received data.

24. The method of claim 22 wherein generating the phase delay signal comprises delaying the clock signal output from a voltage control oscillator to a phase detector receiving the binary signal.

25. The method of claim 22 wherein generating the phase delay signal comprises:

generating a distortion error signal in accordance with a soft decision signal generated by the decision feedback equalizer.

26. The method of claim 25 wherein generating the phase delay signal comprises generating the phase delay signal by processing the distortion error signal.

* * * * *